United States Patent
Wu

(10) Patent No.: US 10,741,636 B2
(45) Date of Patent: Aug. 11, 2020

(54) METHODS OF FABRICATING A DECOUPLING CAPACITOR IN A SEMICONDUCTOR STRUCTURE

(71) Applicant: Micron Technology, Inc., Boise, ID (US)

(72) Inventor: Tieh-Chiang Wu, Taoyuan (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/183,463

(22) Filed: Nov. 7, 2018

(65) Prior Publication Data

US 2019/0074351 A1    Mar. 7, 2019

Related U.S. Application Data

(62) Division of application No. 15/003,765, filed on Jan. 21, 2016, now abandoned.

(51) Int. Cl.
*H01L 49/02* (2006.01)
*H01L 21/3065* (2006.01)
*H01L 29/66* (2006.01)

(52) U.S. Cl.
CPC .......... *H01L 28/91* (2013.01); *H01L 21/3065* (2013.01); *H01L 29/66181* (2013.01)

(58) Field of Classification Search
CPC ... H01L 28/91; H01L 23/642; H01L 21/3065; H01L 29/66181
See application file for complete search history.

(56) References Cited

U.S. PATENT DOCUMENTS

| 5,256,588 A | 10/1993 | Witek et al. |
| 5,394,000 A | 2/1995 | Ellul et al. |
| 5,429,978 A | 7/1995 | Lu et al. |
| 5,595,926 A | 1/1997 | Tseng |
| 8,294,240 B2 | 10/2012 | Nowak et al. |
| 8,525,296 B1 | 9/2013 | Lin et al. |
| 2003/0057558 A1 | 3/2003 | Akiyama |

(Continued)

OTHER PUBLICATIONS

Chinese Office Action from Chinese Application No. 201610181934.9, dated Oct. 8, 2018, 22 pages.

(Continued)

*Primary Examiner* — Thao X Le
*Assistant Examiner* — Gardner W. S. Swan
(74) *Attorney, Agent, or Firm* — TraskBritt

(57) ABSTRACT

A semiconductor structure and a method of fabricating thereof are provided. The semiconductor structure includes a substrate and a capacitor structure. The substrate has a first blind hole and a trench. The first blind hole communicates with the trench. The first blind hole has a first depth, and the trench has a second depth smaller than the first depth. The capacitor structure includes a first inner conductor, a first inner insulator, and an outer conductor. The first inner conductor is in the first blind hole. The first inner insulator surrounds the first inner conductor. The outer conductor has a first portion surrounding the first inner insulator and an extending portion extending from the first portion. The first portion is in the first blind hole, and the extending portion is in the trench. The first inner conductor is separated from the outer conductor by the first inner insulator.

16 Claims, 7 Drawing Sheets

(56) References Cited

U.S. PATENT DOCUMENTS

| | | |
|---|---|---|
| 2006/0267139 A1 | 11/2006 | Thies et al. |
| 2006/0273395 A1 | 12/2006 | Tanaka |
| 2007/0015327 A1 | 1/2007 | Su |
| 2009/0032856 A1 | 2/2009 | Chen et al. |
| 2009/0096001 A1 | 4/2009 | Ludwig et al. |
| 2009/0134491 A1 | 5/2009 | Plum |
| 2011/0027962 A1 | 2/2011 | Bernstein et al. |
| 2014/0159197 A1 | 6/2014 | Weng et al. |
| 2015/0028450 A1* | 1/2015 | Park .................. H01L 23/481 257/532 |
| 2016/0020267 A1 | 1/2016 | Lin |

OTHER PUBLICATIONS

Taiwanese Rejection Decision for Taiwanese Application No. 105109701, dated Aug. 30, 2018, 14 pages.

Taiwanese Office Action and Search Report for Taiwanese Application No. 105109701, dated Dec. 19, 2017, 13 pages with English translation.

Chinese Office Action and Search Report from Chinese Application No. 201610181934.9, dated Jun. 14, 2019, 24 pages.

Taiwanese Office Action from Taiwanese Application No. 105109701, dated Sep. 10, 2019, 16 pages.

CN Office Action from Chinese Patent Office for CN Application No. 201610181934, dated Mar. 27, 2020, 24 pages.

* cited by examiner

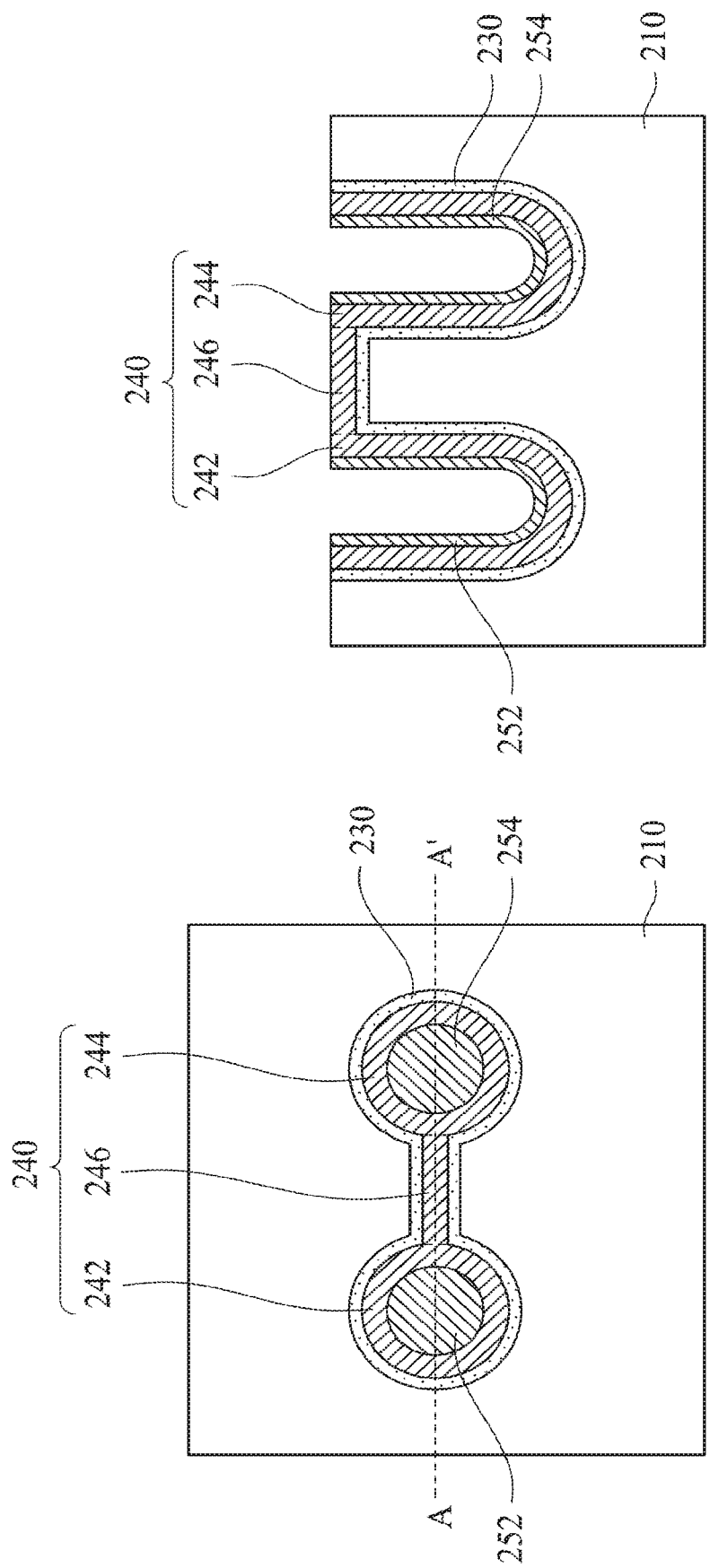

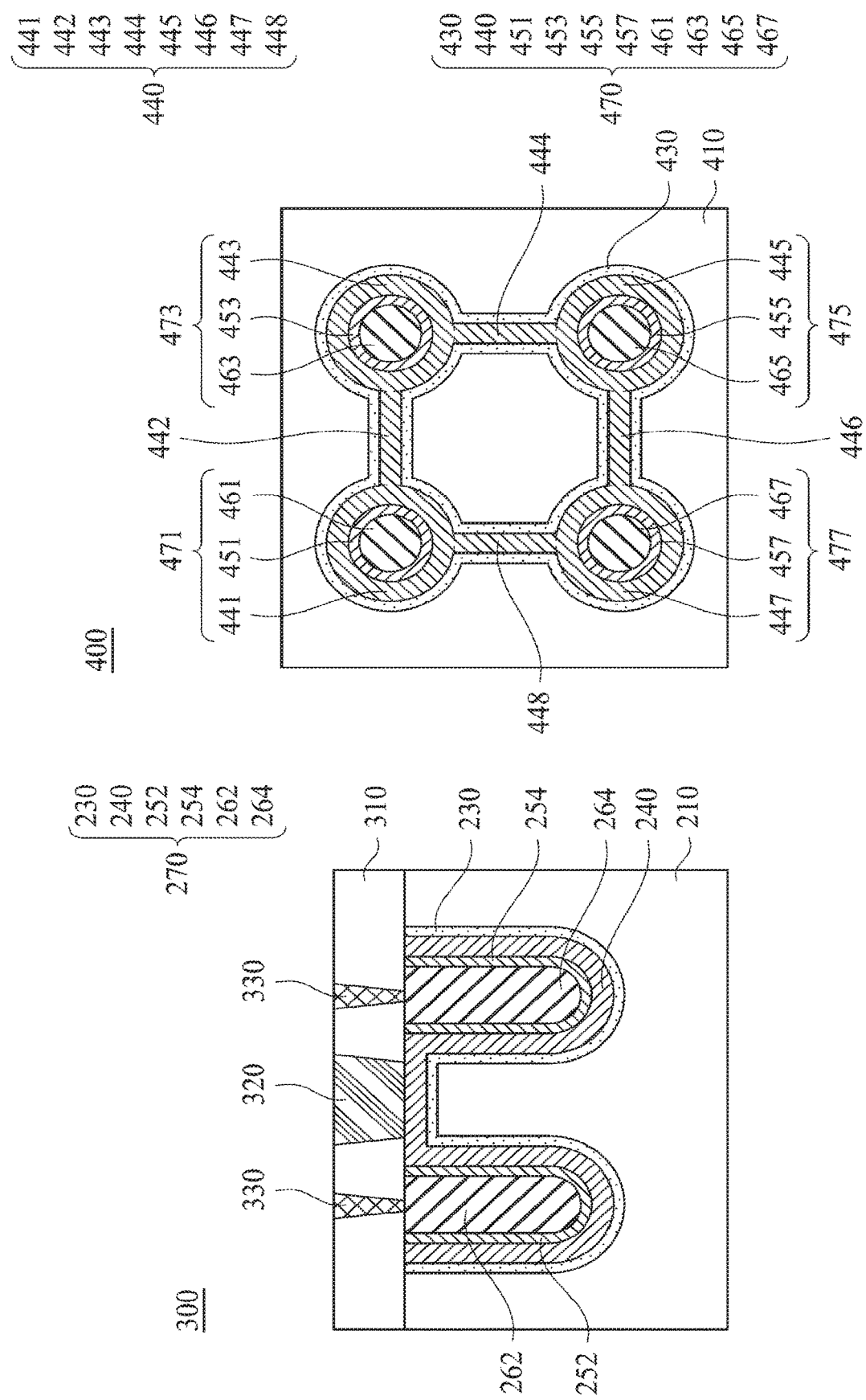

METHODS OF FABRICATING A DECOUPLING CAPACITOR IN A SEMICONDUCTOR STRUCTURE

CROSS-REFERENCE TO RELATED APPLICATION

This application is a divisional of U.S. patent application Ser. No. 15/003,765, filed Jan. 21, 2016, pending, the disclosure of which is hereby incorporated herein in its entirety by this reference.

TECHNICAL FIELD

The present invention relates to a semiconductor structure and a fabricating method thereof. More particularly, the present invention relates to a semiconductor structure having connected capacitors embedded in substrate and a fabricating method thereof.

BACKGROUND

The semiconductor integrated circuit (IC) industry has experienced rapid growth. During the growth, size or geometry of semiconductor devices has greatly decreased. Moreover, in order to promote the performance of semiconductor devices, the placement of decoupling capacitors (DECAPs) is a common approach to reduce the power supply noises and voltage fluctuations and maintain power and signal integrity. Generally, the decoupling capacitor is used in many integrated circuits such as complementary metal-oxide semiconductor (CMOS).

However, because the voltages provided by different power supplies vary within wide limits, it is difficult to implement sufficient decoupling capacitors for all types of power supplies. Specifically, the power supplies providing high voltages are usually in need of the decoupling capacitors with high capacitance to reduce noises. Generally, decoupling capacitors with high capacitance usually require a large amount of installation space that makes it difficult to find space in small-size semiconductor devices to provide enough decoupling capacitors for each power supply. Accordingly, a semiconductor structure including an improved capacitor structure with high capacitance at a small size and a fabricating method of the semiconductor structure are required.

BRIEF SUMMARY

The invention provides a semiconductor structure. The semiconductor structure includes a substrate and a capacitor structure. The substrate has a first blind hole and a trench. The first blind hole communicates with the trench. The first blind hole has a first depth, and the trench has a second depth smaller than the first depth. The capacitor structure includes a first inner conductor, a first inner insulator, and an outer conductor. The first inner conductor is in the first blind hole. The first inner insulator surrounds the first inner conductor. The outer conductor has a first portion surrounding the first inner insulator and an extending portion extending from the first portion. The first portion is in the first blind hole, and the extending portion is in the trench. The first inner conductor is separated from the outer conductor by the first inner insulator.

In one embodiment, an area of the extending portion is smaller than a total area of the first portion, the first inner insulator and the first inner conductor in a plan view.

In one embodiment, a thickness of the extending portion is smaller than a total thickness of the first portion, the first inner insulator and the first inner conductor.

In one embodiment, the semiconductor structure further includes a second blind hole, a second portion of the outer conductor, a second inner insulator, and a second inner conductor. The second blind hole communicates with the trench in the substrate. The second portion of the outer conductor is in the second blind hole. The second inner insulator embeds in the second portion of the outer conductor. The second inner conductor embeds in the second inner insulator.

In one embodiment, the semiconductor structure further includes a first metal layer in contact with the outer conductor, and a second metal layer in contact with the first inner conductor and the second inner conductor.

In one embodiment, the semiconductor structure further includes an outer insulator between the substrate and the outer conductor.

In one embodiment, the outer insulator has a thickness smaller than the second depth of the trench.

In one embodiment, a combined thickness of the outer insulator and the extending portion is equal to the second depth of the trench.

In one embodiment, a thickness of the extending portion is equal to the second depth of the trench.

In one embodiment, a thickness of the extending portion is different from a thickness of the first portion.

In one embodiment, the capacitor structure is coplanar with the substrate.

The invention provides a method of fabricating a semiconductor structure, and the method includes the following steps. A first blind hole and a trench are formed in a substrate. The first blind hole communicates with the trench. The first blind hole has a first depth and the trench has a second depth smaller than the first depth. An outer conductor, which has a first portion in the first blind hole and an extending portion in the trench, is formed. A first inner insulator is formed over the first portion. A first inner conductor is formed over the first inner insulator and separated from the first portion by the first inner insulator.

In one embodiment, the method further includes the following steps. A second blind hole communicating with the trench is formed in the substrate. A second portion of the outer conductor is formed in the second blind hole. A second inner insulator is formed over the second portion. A second inner conductor is formed over the second inner insulator and separated from the second portion by the second inner insulator.

In one embodiment, the second blind hole has a third depth larger than the second depth of the trench.

In one embodiment, the first depth of the first blind hole is different from the third depth of the second blind hole.

In one embodiment, the method further includes forming an outer insulator in the first blind hole and the trench, before forming the outer conductor.

In one embodiment, a thickness of the outer insulator is smaller than the second depth of the trench.

In one embodiment, the outer conductor fills the trench.

In one embodiment, the method further includes forming a first metal layer in contact with the outer conductor and a second metal layer in contact with the first inner conductor and the second inner conductor.

In one embodiment, the first blind hole and the trench are formed by laser drilling, dry etching, or wet etching.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIGS. 2A, 3A, 4A, 5A and 6A are plan views of a semiconductor structure at various stages of fabrication, in accordance with one embodiment FIGS. 2B, 3B, 4B, 5B and 6B are cross-sectional views of FIGS. 2A, 3A, 4A, 5A and 6A along the line A-A', respectively.

FIG. 7 is a cross-sectional view of a semiconductor structure at a stage of fabrication, in accordance with one embodiment.

FIG. 8 is a plan view of a semiconductor structure at a stage of fabrication, in accordance with one embodiment.

DETAILED DESCRIPTION

Figure 1:
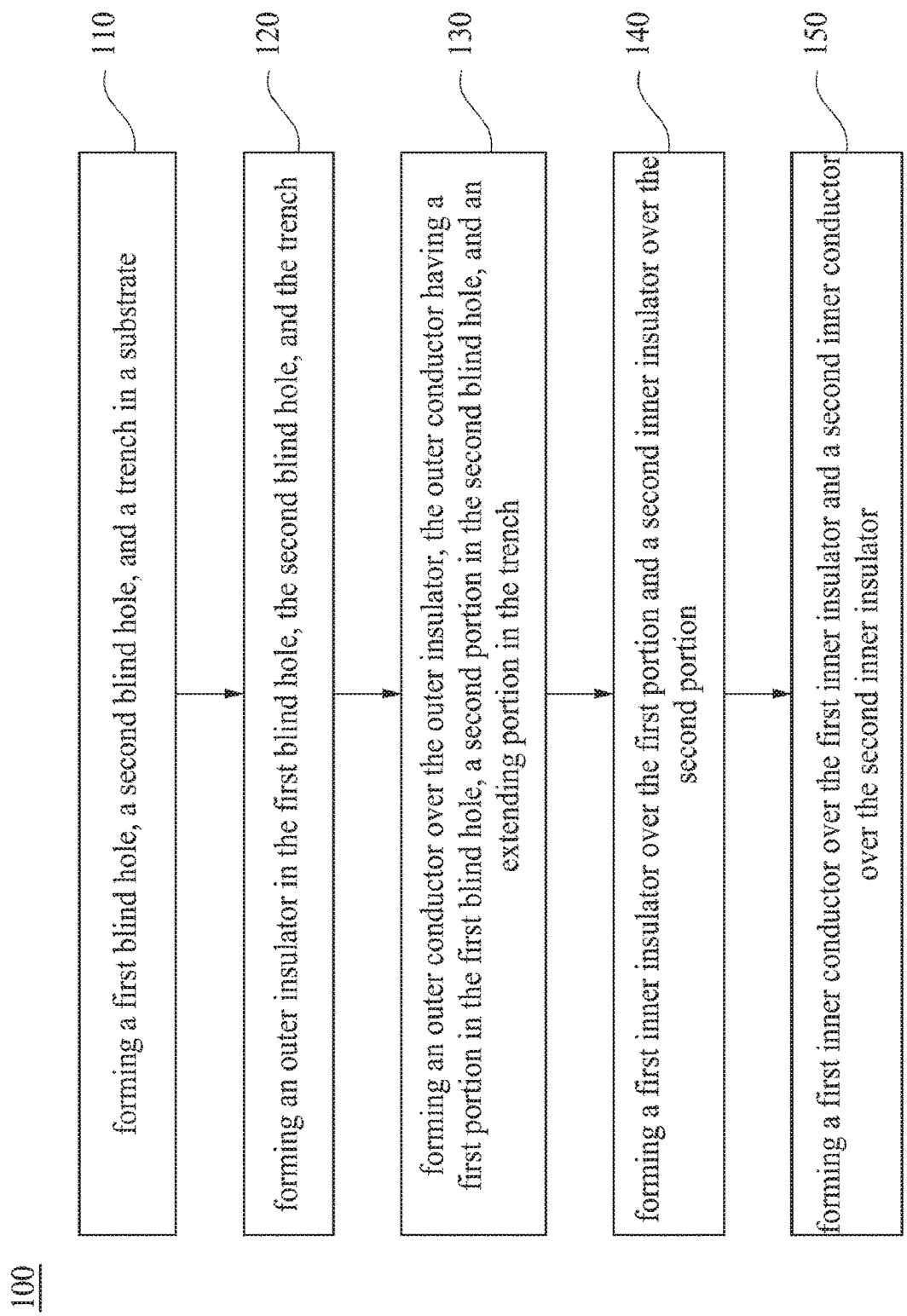
FIG. 1 is a flowchart of a method of fabricating a semiconductor structure, in accordance with one embodiment.

Reference will now be made in detail to the present embodiments of the invention, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

It will be understood that when an element is referred to as being "on" another element, it can be directly on the other element or intervening elements may be present therebetween. Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

As aforementioned problems, it is difficult to implement sufficient decoupling capacitors for all types of power supplies. Further, decoupling capacitors with high capacitance usually require a large amount of installation space in semiconductor devices. Accordingly, the instant disclosure provides a semiconductor structure including an innovative capacitor structure with high capacitance and a fabricating method of the semiconductor structure. The capacitance of the capacitor structure can be easily adjusted for satisfying all types of power supplies at small size. The fabricating method has advantages such as simple process and low process cost.

FIG. 1 is a flowchart of a method of fabricating a semiconductor structure, in accordance with one embodiment. FIGS. 2A, 3A, 4A, 5A and 6A are plan views of a semiconductor structure at various stages of fabrication. FIGS. 2B, 3B, 4B, 5B and 6B are cross-sectional views of FIGS. 2A, 3A, 4A, 5A and 6A along the line A-A', respectively.

Figure 2B:
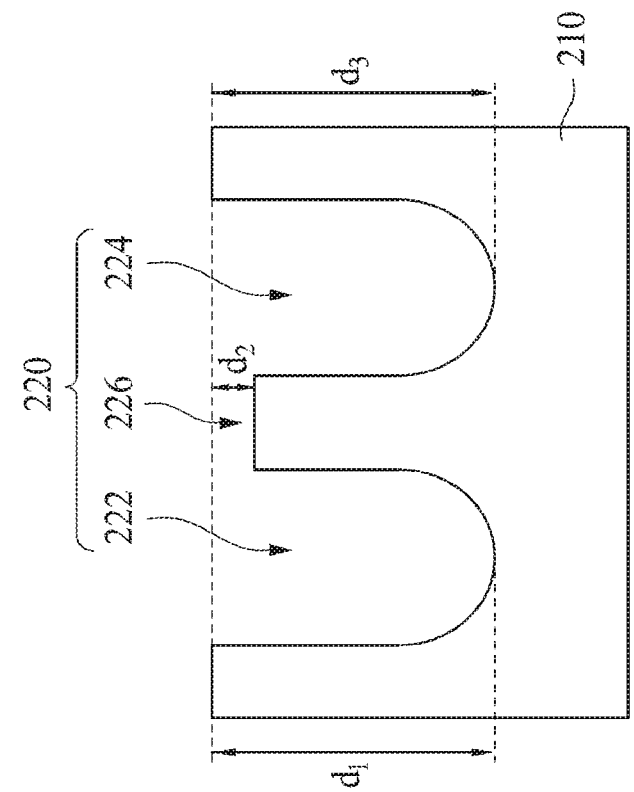
Figure 2A:
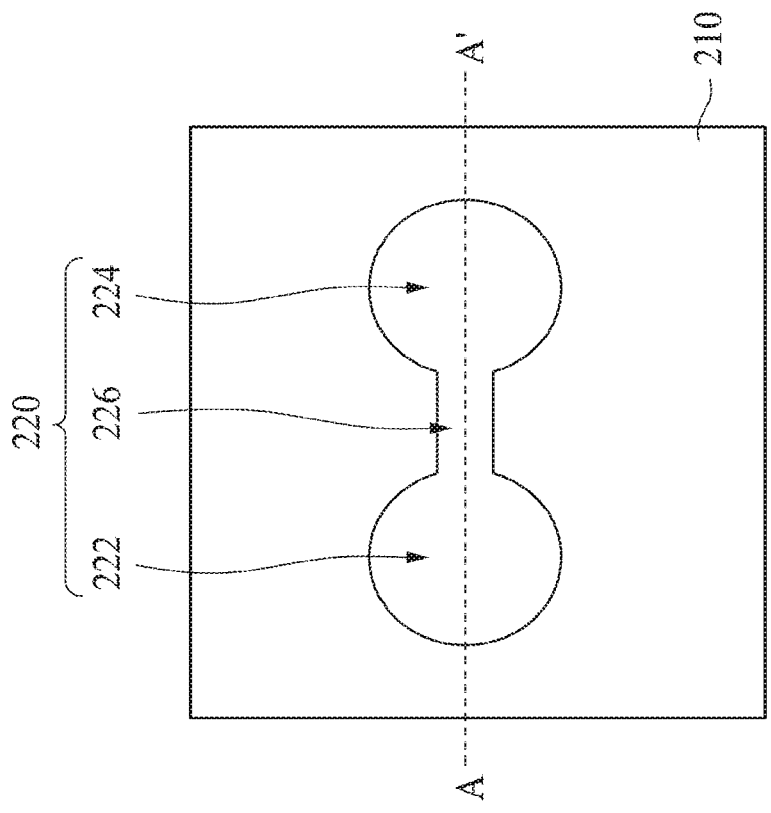

The flowchart 100 of FIG. 1 begins with operation 110. Referring to FIGS. 2A and 2B, a first blind hole 222, a second blind hole 224, and a trench 226 are formed in a substrate 210. Both the first blind hole 222 and the second blind hole 224 communicate with the trench 226. Therefore, the first blind hole 222 communicates with the second blind hole 224 by the trench 226. Further, the first blind hole 222, the second blind hole 224, and the trench 226 constitute a recess 220. Specifically, the recess 220 is dumbbell-shaped in a plan view, as shown in FIG. 2A.

As shown in FIG. 2B, the first blind hole 222 has a first depth $d_1$, the trench 226 has a second depth $d_2$, and the second blind hole 224 has a third depth $d_3$. The second depth $d_2$ of the trench 226 is smaller than the first depth $d_1$ of the first blind hole 222 and is smaller than the third depth $d_3$ of the second blind hole 224 as well.

In one embodiment, the recess 220 is formed by laser drilling, dry etching, or wet etching. For example, the substrate 210 may be etched by dry etching such as reactive ion etching (RIE) to form the recess 220. The RIE includes, but not limited to, cryogenic deep reactive ion etching (DRIE) or Bosch deep reactive ion etching. In one embodiment, the recess 220 is formed by a dry etching process. At first, a photoresist (PR) layer (not shown) is formed over the substrate 210, which has a first opening, a second opening and a third opening. The second opening is smaller than both first opening and third opening. Subsequently, the substrate 210 is etched through the first opening to form the first blind hole 222, through the second opening to form the trench 226, and through the third opening to form the second blind hole 224. Because of RIE lag, the second depth $d_2$ of the trench 226 is smaller than both the first depth $d_1$ of the first blind hole 222 and the third depth $d_3$ of the second blind hole 224, as shown in FIG. 2B.

According to the dry etching processes described above, the depths of blind holes and a trench can be controlled by adjusting the size of openings in the photoresist layer. Therefore, in one embodiment, the first depth $d_1$ of the first blind hole 222 is different from the third depth $d_3$ of the second blind hole 224.

In one embodiment, the substrate 210 is a die or silicon wafer, which may include active components, such as N-channel field effect transistors (NFETs), P-channel field effect transistors (PFETs), metal-oxide-semiconductor field effect transistors (MOSFETs), complementary metal-oxide-semiconductor (CMOS) transistors, high voltage transistors, and/or high frequency transistors, and/or passive components such as resistors and/or inductors, and/or combinations thereof. The silicon wafer includes a material of Si, SiGe, SiGeC or SiC, a layered semiconductor such as Si/SiGe or a silicon-on-insulator (SOI).

Figure 3B:
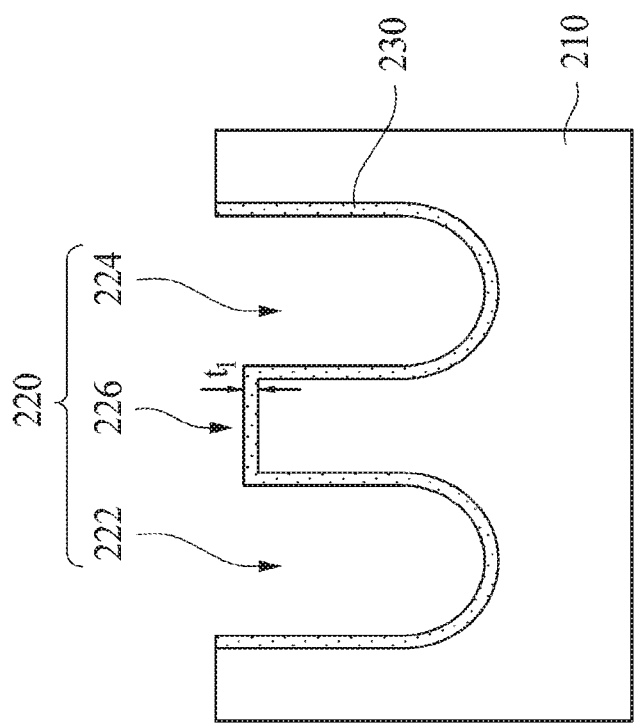
Figure 3A:
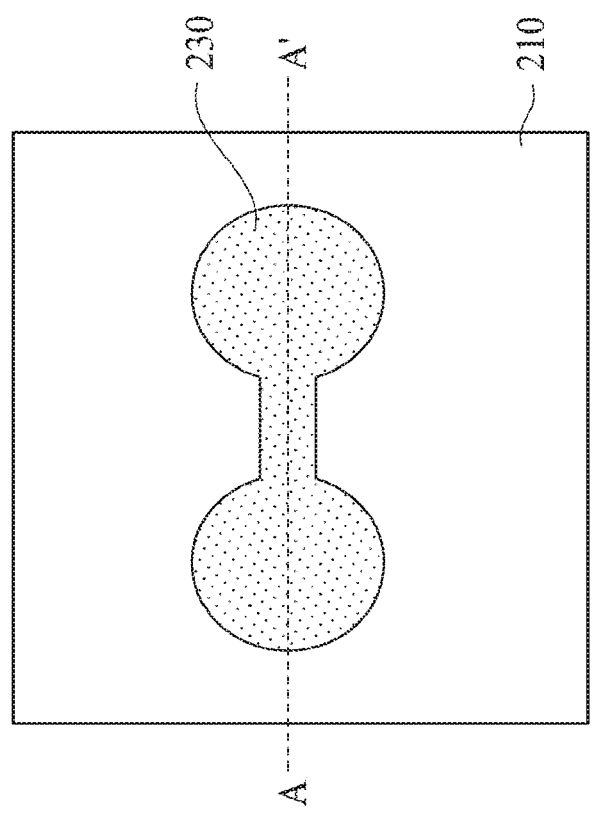

Continuing to operation 120 and referring to FIGS. 3A and 3B, an outer insulator 230 is formed in the first blind hole 222, the second blind hole 224, and the trench 226. In one embodiment, the outer insulator 230 is formed by chemical vapor deposition (CVD), atomic layer deposition (ALD), physical vapor deposition (PVD) or plasma-enhanced chemical vapor deposition (PECVD) and is made of silicon nitride or silicon dioxide. In one embodiment, the operation 120 is omitted.

It is worth noting that the outer insulator 230 has a thickness $t_1$ smaller than the second depth $d_2$ of the trench 226. In other words, the trench 226 is not filled with the outer insulator 230. Therefore, the remaining part of the trench 226 is capable of being filled in other materials, after forming the outer insulator 230 in the trench 226.

Figure 4B:
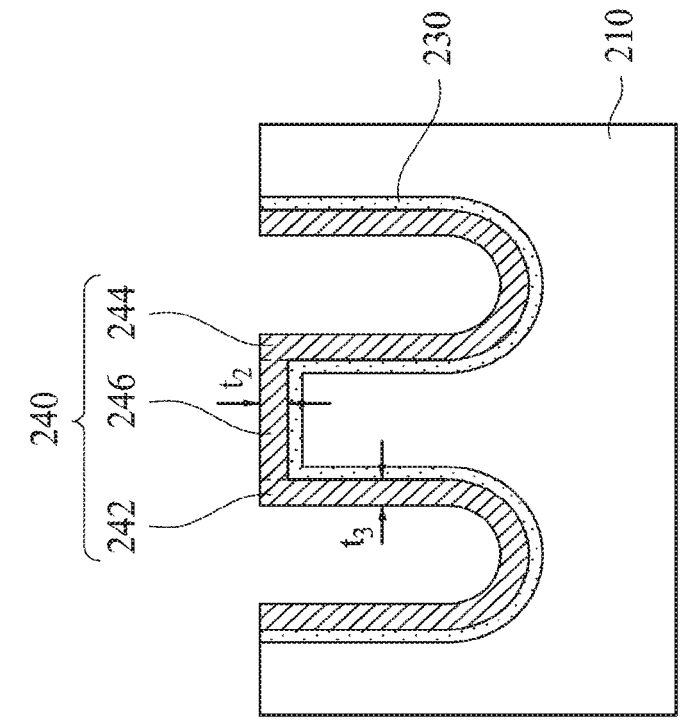
Figure 4A:
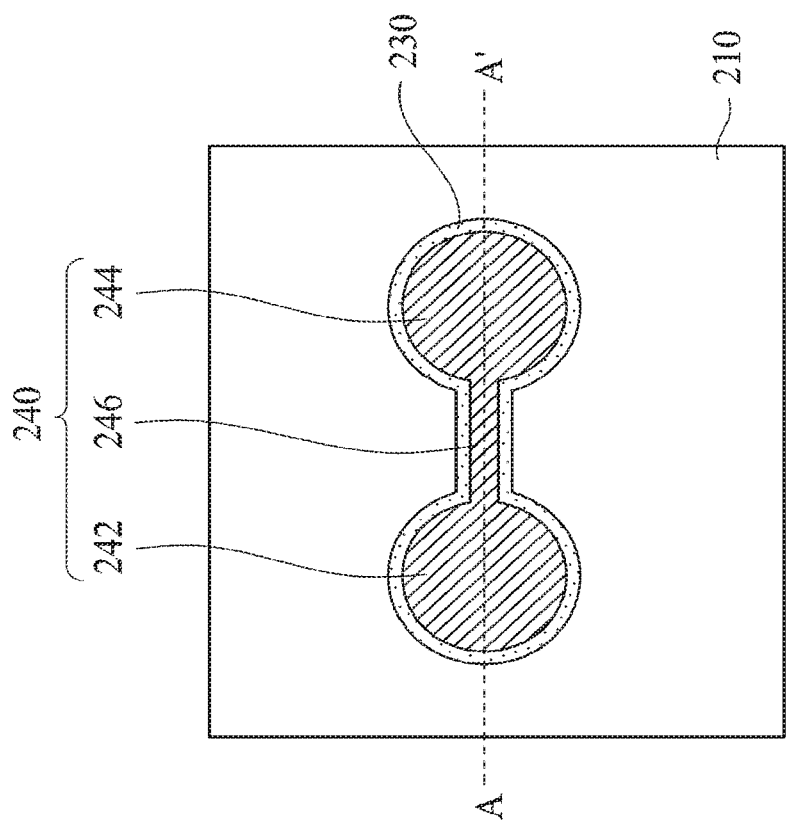

Continuing to operation 130 and referring to FIGS. 4A and 4B, an outer conductor 240 is formed over the outer insulator 230. The outer conductor 240 has a first portion 242 in the first blind hole 222, a second portion 244 in the second blind hole 224, and an extending portion 246 in the trench 226. The extending portion 246 extends from the first portion 242 to the second portion 244. Further, the outer insulator 230 and the extending portion 246 fill the trench 226. That is, a combined thickness of the outer insulator 230 and the extending portion 246 is equal to the second depth $d_2$ of the trench 226. The combined thickness is equal to sum of the thickness $t_1$ of the outer insulator 230 and a thickness $t_2$ of the extending portion 246. However, in an alternative embodiment, the outer insulator 230 is omitted. Therefore, the trench 226 is filled with the extending portion 246 only. In other words, a thickness of the extending portion 246 is equal to the depth of the trench 226.

In one embodiment, the outer conductor 240 is formed by CVD, ALD, PVD or PECVD and is made of any suitable conductive material such as tungsten, aluminum, copper, polysilicon or alloy. By the above forming methods, a thickness b of extending portion 246 may be different with a thickness b of the first portion 242.

Further, the first blind hole 222 is not filled with the first portion 242 of the outer conductor 240 and the second blind hole 224 is not filled with the second portion 244 of the outer conductor 240 as well. Therefore, the remaining parts of the first blind hole 222 and the second blind hole 224 are capable of being filled in other materials.

Continuing to operation 140 and referring to FIGS. 5A and 5B, a first inner insulator 252 is formed over the first portion 242 and a second inner insulator 254 is formed over the second portion 244. The forming methods and materials of the first inner insulator 252 and the second inner insulator 254 can refer to the embodiment of forming the outer insulator 230.

Figure 6B:
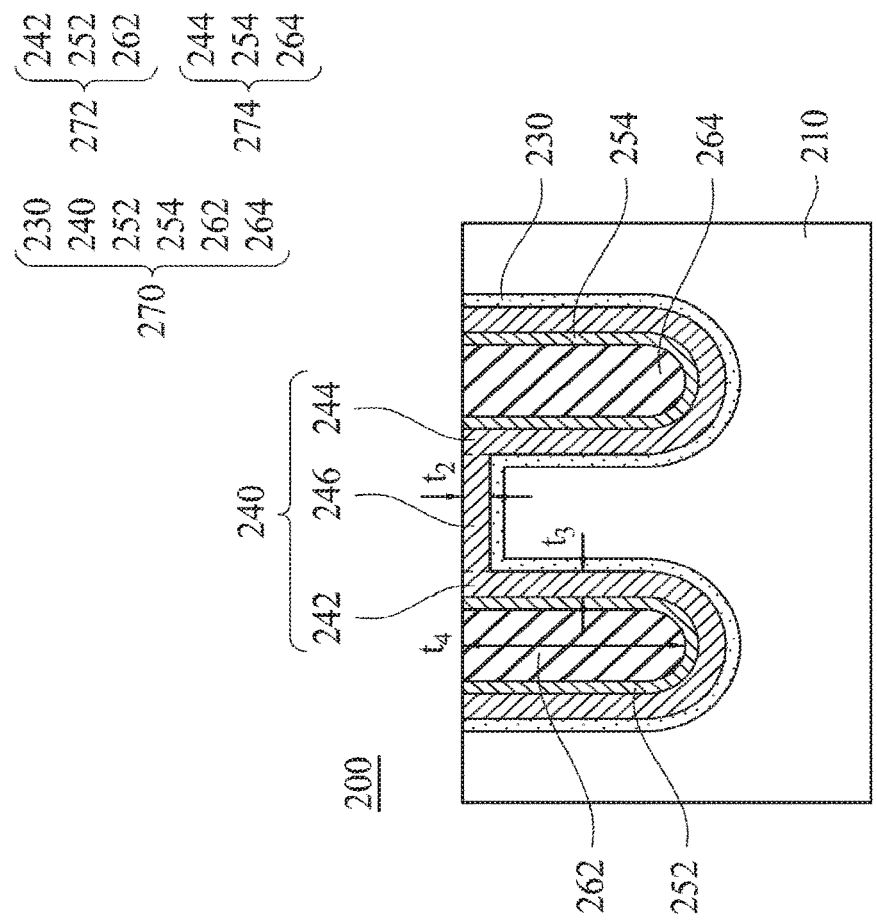
Figure 6A:
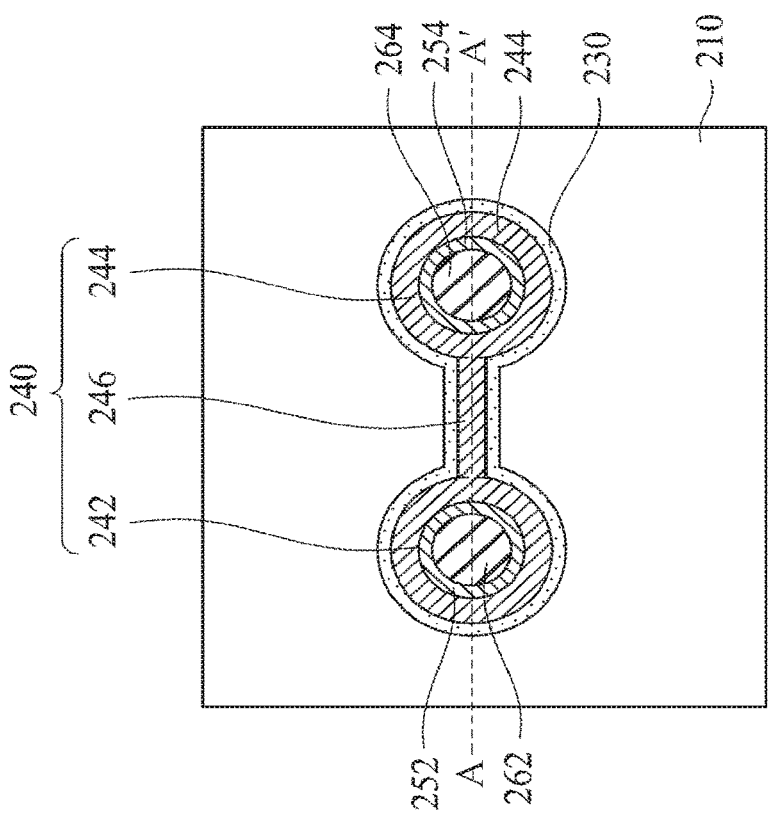

Continuing to operation 150 and referring to FIGS. 6A and 6B, a first inner conductor 262 is formed over the first inner insulator 252 and a second inner conductor 264 is formed over the second inner insulator 254 to form a semiconductor structure 200. The outer insulator 230, the outer conductor 240, the first inner insulator 252, the second inner insulator 254, the first inner conductor 262 and the second inner conductor 264 form a capacitor structure 270. In one embodiment, the capacitor structure 270 is coplanar with the substrate 210 as shown in FIG. 6B. The forming methods and materials of the first inner conductor 262 and the second inner conductor 264 can refer to the embodiment of forming the outer conductor 240.

In detail, the outer insulator 230 is between the substrate 210 and the outer conductor 240. The first inner conductor 262 is in the first blind hole 222. The first inner insulator 252 conformally surrounds the first inner conductor 262. The first portion 242 of the outer conductor 240 conformally surrounds the first inner insulator 252. The first inner conductor 262 is separated from the outer conductor 240 by the first inner insulator 252. Further, the second inner conductor 264 is in the second blind hole 224. The second inner insulator 254 conformally surrounds the second inner conductor 264. The second portion 244 of the outer conductor 240 conformally surrounds the second inner insulator 254. The second inner conductor 264 is separated from the outer conductor 240 by the second inner insulator 254.

In other words, the first inner insulator 252 embeds in the first portion 242 of the outer conductor 240 and the first inner conductor 262 embeds in the first inner insulator 252. The second inner insulator 254 embeds in the second portion 244 of the outer conductor 240 and the second inner conductor 264 embeds in the second inner insulator 254.

Further, as shown in FIG. 6A, an area of the extending portion 246 is smaller than a total area of the first portion 242, the first inner insulator 252 and the first inner conductor 262 in a plan view. As shown in FIG. 6B, a thickness $t_2$ of the extending portion 246 is smaller than a total thickness $t_4$ of the first portion 242, the first inner insulator 252 and the first inner conductor 262.

It is worth noting that the first portion 242, the first inner insulator 252 and the first inner conductor 262 form a first capacitor 272, and the second portion 244, the second inner insulator 254 and the second inner conductor 264 form a second capacitor 274. The first capacitor 272 is electrically connected to the second capacitor 274 by the extending portion 246 of the outer conductor 240 to form connected capacitors in the substrate 210.

Because the first capacitor 272 and the second capacitor 274 are trench-type capacitors, both occupy a smaller space than planar-type capacitors. It is beneficial for reducing the size of semiconductor devices. Moreover, because, firstly, the first capacitor 272 and the second capacitor 274 can be easily connected by the extending portion 246 without an additional connecting line and, secondly, the forming process of the extending portion 246 is integrated into the forming process of the first capacitor 272 and the second capacitor 274, the fabricating method of the instant disclosure may simplify the necessary steps of forming a connection between the first capacitor 272 and the second capacitor 274. Therefore, the fabricating method has advantages such as a simple process and low process cost.

Further, the extending portion 246 is embedded in the substrate 210, so such a structural design is beneficial for reducing the size of semiconductor devices. By connecting the first capacitor 272 and the second capacitor 274, the capacitance of the capacitor structure 270 is higher than a single first capacitor 272 or second capacitor 274. Therefore, the capacitor structure 270 with higher capacitance can be used for promoting the performance of high-voltage power supply and has more extensive applications.

FIG. 7 is a cross-sectional view of a semiconductor structure 300 at a stage of fabrication, in accordance with one embodiment. A dielectric layer 310 with openings is formed on the substrate 210 and the capacitor structure 270. The openings are subsequently filled with a first metal layer 320 and a second metal layer 330 to form the semiconductor structure 300. Compared to the semiconductor structure 200 shown in FIG. 6B, the semiconductor structure 300 further includes the dielectric layer 310 covering the substrate 210 and the capacitor structure 270, the first metal layer 320 in contact with the outer conductor 240, and the second metal layer 330 in contact with both the first inner conductor 262 and the second inner conductor 264. Because the second metal layer 330 has continuity, the first inner conductor 262 is electrically connected to the second inner conductor 264. The capacitor structure 270 can be connected with other components, such as power supplies through the first metal layer 320 and the second metal layer 330.

FIG. 8 is a plan view of a semiconductor structure at a stage of fabrication, in accordance with one embodiment. A capacitor structure 470 is embedded in a substrate 410 to form a semiconductor structure 400. The capacitor structure 470 includes an outer insulator 430, an outer conductor 440, inner insulators 451, 453, 455 and 457, and inner conductors 461, 463, 465, and 467. The outer conductor 440 has a first portion 441, a second portion 443, a third portion 445, a fourth portion 447 and extending portions 442, 444, 446 and 448. The first portion 441 surrounds the inner insulator 451, and the inner insulator 451 surrounds the inner conductor 461 and separates the inner conductor 461 from the first portion 441 to form a first capacitor 471. A second capacitor 473, a third capacitor 475 and a fourth capacitor 477 have the same structure as the first capacitor 471, so unnecessary details will not be described herein. It is worth noting that the first capacitor 471 is connected with the second capacitor 473 by the extending portion 442 and connected with the fourth capacitor 477 by the extending portion 448. That means one capacitor can connect with two capacitors. It can be easily deduced that one capacitor is capable of connecting with more than two capacitors to increase capacitance. Therefore, by adjusting the amount of capacitors in the capacitor structure, we can easily adjust the capacitance for satisfying all types of power supplies. Moreover, by connecting a sufficient amount of capacitors by extending portions, the capacitor structure can have high enough capacitance to reduce the power supply noises, reduce voltage fluctuations and maintain power and signal integrity and thus promote the performance of semiconductor devices.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the appended claims.

What is claimed is:

1. A method of fabricating a semiconductor structure, comprising:
    substantially simultaneously forming, into but not through semiconductor material of a substrate:
        a first blind hole, a second blind hole, and a trench, the first blind hole and the second blind hole directly connected with the trench, the first blind hole having a first depth, the trench having a second depth smaller than the first depth and the second blind hole having a third depth greater than the second depth; and
    forming a decoupling capacitor, comprising:
        forming an outer conductor that has a first portion in the first blind hole, a second portion in the second blind hole and an extending portion in the trench;
        forming a first inner insulator over the first portion;
        forming a first inner conductor over the first inner insulator and separated from the first portion by the first inner insulator;
        forming a second inner insulator over the second portion; and
        forming a second inner conductor over the second inner insulator and separated from the second portion by the second inner insulator.

2. The method of claim 1, further comprising forming the first depth of the first blind hole to be different from the third depth of the second blind hole.

3. The method of claim 1, further comprising forming an outer insulator in the first blind hole, the second blind hole and the trench, before forming the outer conductor.

4. The method of claim 3, further comprising forming a thickness of the outer insulator to be smaller than the second depth of the trench.

5. The method of claim 1, further comprising filling the trench with the outer conductor.

6. The method of claim 1, further comprising forming a first metal layer in contact with the outer conductor and a second metal layer in contact with the first inner conductor and the second inner conductor.

7. The method of claim 1, wherein forming the first blind hole and the trench is effected by at least one of laser drilling, dry etching, or wet etching.

8. The method of claim 1, further comprising forming each of the first blind hole and the second blind hole to be round in transverse cross-section and have a rounded bottom.

9. The method of claim 1, further comprising forming each of the first blind hole and the second blind hole to be round in transverse cross-section and, in combination with the trench, to exhibit a dumbbell shape in a plan view.

10. The method of claim 6, further comprising electrically connecting the first inner conductor to the second inner conductor with the second metal layer.

11. The method of claim 1, further comprising:
    forming at least a third blind hole;
    forming at least a second trench connecting the at least a third blind hole to at least one of the first and second blind holes;
    forming at least a third portion of the outer conductor in the third blind hole and at least a second extending portion connecting the at least a third portion of the outer conductor to at least one of the first and second portions of the outer conductor;
    forming at least a third inner insulator over the at least a third portion of the outer conductor; and
    forming at least a third inner conductor over the at least a third inner insulator and separated from the at least a third portion of the outer conductor by the at least a third inner insulator.

12. The method of claim 1, wherein substantially simultaneously forming the first blind hole, the second blind hole and the trench comprises forming the first blind hole, the second blind hole and the trench in the semiconductor material of the substrate by dry etching.

13. The method of claim 1, further comprising forming a thickness of the extending portion of the outer conductor to be different than a thickness of at least one of the first and second portions of the outer conductor.

14. The method of claim 1, further comprising substantially simultaneously forming the first portion, the second portion and the extending portion of the outer conductor.

15. The method of claim 4, further comprising forming a combined thickness of the outer insulator and the extending portion of the outer conductor to be substantially equal to the second depth of the trench.

16. The method of claim 3, further comprising substantially simultaneously forming the outer insulator in the first blind hole, the second blind hole and the trench.

\* \* \* \* \*

UNITED STATES PATENT AND TRADEMARK OFFICE
CERTIFICATE OF CORRECTION

PATENT NO. : 10,741,636 B2  
APPLICATION NO. : 16/183463  
DATED : August 11, 2020  
INVENTOR(S) : Tieh-Chiang Wu Page 1 of 1

It is certified that error appears in the above-identified patent and that said Letters Patent is hereby corrected as shown below:

On the Title Page  
In ITEM (72), Line 1    change "Taoyuan (TW)" to --Taoyuan City (TW)--

Signed and Sealed this  
Eighth Day of December, 2020

Andrei Iancu  
*Director of the United States Patent and Trademark Office*